(12) United States Patent
Adel et al.

(10) Patent No.: US 7,571,422 B2
(45) Date of Patent: Aug. 4, 2009

(54) METHOD FOR GENERATING A DESIGN RULE MAP HAVING SPATIALLY VARYING OVERLAY BUDGET

(75) Inventors: Michael Adel, Zichron Ya'akov (IL); Ellis Chang, Saratoga, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/857,301

(22) Filed: Sep. 18, 2007

(65) Prior Publication Data

US 2008/0077894 A1   Mar. 27, 2008

Related U.S. Application Data

(60) Provisional application No. 60/826,507, filed on Sep. 21, 2006.

(51) Int. Cl.
*G06F 17/50* (2006.01)
(52) U.S. Cl. ............... 716/19; 716/2; 716/4; 716/18
(58) Field of Classification Search ............... 716/2, 716/4, 18, 19; 703/14
See application file for complete search history.

(56) References Cited

U.S. PATENT DOCUMENTS

2004/0233439 A1* 11/2004 Mieher et al. ............... 356/401

OTHER PUBLICATIONS

International Search Report in corresponding PCT application PCT/US07/79053, mailed Jul. 16, 2008.
Written Opinion in corresponding PCT application PCT/US07/79053, mailed Jul. 16, 2008.

* cited by examiner

*Primary Examiner*—Thuan Do
(74) *Attorney, Agent, or Firm*—Suiter Swantz pc llo

(57) ABSTRACT

The invention is a method for generating a design rule map having a spatially varying overlay error budget. Additionally, the spatially varying overlay error budget can be employed to determine if wafers are fabricated in compliance with specifications. In one approach a design data file that contains fabrication process information and reticle information is processed using design rules to obtain a design map with a spatially varying overlay error budget that defines a localized tolerance to overlay errors for different spatial locations on the design map. This spatially varying overlay error budget can be used to disposition wafers. For example, overlay information obtained from measured metrology targets on a fabricated wafer are compared with the spatially varying overlay error budget to determine if the wafer overlay satisfies the required specification.

16 Claims, 3 Drawing Sheets

METHOD FOR GENERATING A DESIGN RULE MAP HAVING SPATIALLY VARYING OVERLAY BUDGET

RELATED APPLICATIONS

This application is related to and claims priority to U.S. Provisional Application No. 60/826,507 filed Sep. 21, 2006, entitled "Design Rule Checking for Metrology and Inspection", by Adel, et al. the contents of which are hereby incorporated by reference in their entirety.

TECHNICAL FIELD

The invention described herein relates generally to semiconductor fabrication and inspection technologies. In particular, the invention refers improved methods of inspecting substrates and associated scatterometry targets used in lithography processes, wherein said methodologies use a spatially varying design rule overlay error budget to enable improved overlay lot dispositioning for wafer fabrication processes. Particularly, the invention refers to method embodiments capable of generating a spatially varying design rule overlay error budget for a design map. In another embodiment, comparisons between the design map and the actual fabrication substrate using the spatially varying design rule overlay error budget can be used to disposition actual wafers. Moreover, said comparisons between the design map and the actual fabrication substrate using the spatially varying design rule overlay error budget can be used to determine the effectiveness of correctibles used to improve pattern fidelity in an associated fabrication process.

BACKGROUND

As is well-understood in the art, lithography processes are used in the fabrication of the various layers in semiconductor wafer processing. Important to such lithography fabrication processes is the correct and accurate alignment and orientation of various fabrication layers formed on a wafer. Each of the layers formed must be aligned within a certain level of accuracy otherwise the incidence of circuitry failure in a wafer (and its associated dies) is excessive. As is also known, overlay metrology targets are used to obtain accurate measurements of target features. In particular, such targets can be used to obtain accurate measurements of overlay errors between layers. Such targets commonly include arrays of uniformly constructed and uniformly spaced periodic features arranged to provide the best possible targeting information. Typical prior art example targets include periodic gratings or periodically configured higher dimensional target arrays comprised of a plurality of uniformly spaced and sized metrology features. Additionally, so-called "box-in-box (BiB) overlay targets find common usage.

Such periodic targeting structures typically feature two layers of similarly oriented periodic gratings formed one over the other. Typically, the layers are designed with a specified predetermined offset with respect to each other. This enables scattering signals to be generated when illuminated by a light beam. A comparison of the actual signal produced with the expected scattering signal enables highly accurate overlay metrology measurements to be made.

Measurements of the targets can be used to determine whether an overlying layer formed over an underlying layer is positioned with sufficient accuracy. Correctly positioned layers indicate that the fabrication processes can progress to further processing steps without adjustment. Layers that are misaligned badly enough may impair the electrical function of the dice formed on a wafer and require a reworking of the wafer and/or adjustment of fabrication parameters to enable a more accurate placement of the overlying layer.

In the existing art, analysis of a design file (e.g., a GDS (Graphic Data System) type file or other design data file associated with relevant mask reticle information) that describes an IC layout and other relevant design data is used to determine an error overlay budget for the alignment of two overlying layers. Such an overlay error budget can be determined using overlay modeling. Typically, a single parameter is used to characterize the permissible level of overlay error in an entire layer of a wafer (or alternatively an entire stepper field).

For example, Maximum Error Prediction (MEP) may be used to obtain a model-based lot "dispositioning parameter". This parameter describes the maximum acceptable overlay error that will result in a functional die. Commonly, this involves identifying the regions of a layer most sensitive to layer misplacement (e.g., regions likely to suffer electrical failures in the event of the smallest layer misalignment). Then the maximum amount of misplacement is determined (for example, the maximum amount of misalignment that will still result in electrically functional circuitry). In other words, a worse case modeled overlay error is determined and used as the dispositioning parameter for the entire wafer or, alternatively, the entire scanning field of the fabrication device. Thus, for the entire wafer or field, the same parameter is used. Thus, one number is used to describe the acceptable limit for error tolerance for the entire wafer (or alternatively for the entire scanning field of the fabrication device). This has the advantage of providing a quick, simple, and easily applicable parameter that currently enjoys wide applicability in the industry. However, this method has the disadvantage of imposing an unnecessarily tight tolerance on the whole wafer, when many of the areas of the wafer may not require such a tight tolerance.

Once a dispositioning parameter is determined, metrology measurements are then made of the various targets on the wafer and the degree of overlay error is determined for the wafer based on these metrology measurements. Then the determined overlay error can be compared to the dispositioning parameter. Based on this comparison, a decision regarding wafer disposition is made. Metrology measurements having overlay errors greater than the dispositioning parameter generally indicate that the wafer must be reworked or discarded as necessary. Other methods of obtaining dispositioning parameters are also known and employed to generate single value dispositioning parameters. But in all such cases, the practiced methodologies require the determination of a single worst case dispositioning parameter that is used to provide a quick and simple method of dispositioning wafers (or portions of a wafer) based on a comparison to one threshold value (dispositioning parameter).

As indicated briefly above, a disadvantage of such methods is that they operate under the assumption that the overlay error budget is equal at all points on the wafer (or across the scanner field). However, in reality, some areas of a wafer or scanner field are much more sensitive to overlay errors than others. For example, some portions of a wafer design may be more susceptible to electrical failure if the pattern is misaligned than other portions of the wafer. However, present dispositioning technologies have no way of taking this into consideration. Because existing technologies rely on a single dispositioning parameter, such a simplified analysis of a surface may result in the rejection of wafers that may, in actuality, have satisfactory electrical function. Unfortunately, this can result in the rejection of functional and satisfactory wafers requiring unnecessary reworking and/or reprocessing when they would not otherwise need such additional processing. This is time consuming, costly, and in general wasteful.

Therefore, although existing dispositioning processes and tools are generally suitable for their intended purposes, improvements can be made. The present invention seeks to go beyond the limitations and structural shortcomings of existing technologies to provide an improved method of dispositioning wafers.

SUMMARY OF THE INVENTION

In accordance with the principles of the present invention, methods of generating a spatially varying overlay error budget and using the same to disposition wafers and substrates are disclosed.

In one embodiment, the invention is a method for generating a design rule map having a spatially varying design rule overlay budget. A design data file is provided, the data file characterizes a fabrication process used for forming a pattern on a semiconductor substrate. Information contained in the design data file is processed to generate a design map with a spatially varying overlay error budget that defines a localized tolerance to overlay errors for different spatial locations on the design map. Portions of the map having a pattern that is relatively tolerant of overlay error having a relatively larger overlay error budget and portions of the map having a pattern that is relatively intolerant of overlay error having a relatively smaller overlay error budget.

Another embodiment of the invention concerns a method of dispositioning a wafer substrate. The embodiment includes a wafer substrate having features fabricated in accordance with pattern information contained within a design data file. The wafer substrate includes at least one layer of features that is formed over an underlying pattern of features and wherein the evaluated substrate includes a plurality of overlay metrology targets. The design data file that characterizes the fabrication process used for forming patterns on a semiconductor substrate is processed to generate a design map with a spatially varying overlay error budget that defines a localized tolerance to overlay errors for different spatial locations on the design map. A plurality of overlay metrology measurements are performed on the overlay metrology targets. The overlay error measurements are compared with the spatially varying design rule overlay error budget for the design map and the wafer substrate is dispositioned based on whether the overlay error measurements are in compliance with the spatially varying design rule overlay error budget for the design map.

Another embodiment of the invention comprises a method for tracking and adjusting fabrication parameters used to form layers on a substrate. The method includes providing a set of substrates, with each substrate having an uppermost layer first pattern layer. A second pattern layer is fabricated over the first pattern layer so that said first and second layers include a plurality of overlay metrology targets formed at different locations on each substrate. A plurality of metrology measurements are performed on the metrology targets of each substrate to obtain measured overlay error information for each of the different locations on each substrate. This measured overlay error information is processed for each substrate to generate a measured overlay error model for each substrate. A design data file is processed to obtain a spatially varying overlay error budget. The design data file characterizes fabrication processes used on the substrates, including those processes used for forming the first and second pattern layers on the substrates. The spatially varying overlay error budget is operable on each of the substrates and varies for different portions of the substrate surface depending on a local tolerance of various portions of the substrate surface to overlay errors. For each substrate, a spatially varying set of residuals is obtained that characterize the degree of measured overlay error as a function of position on the measured substrate. The wafers are dispositioned based on information contained in the residuals.

Other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which.

DETAILED DESCRIPTION OF THE INVENTION

Figure 1A:
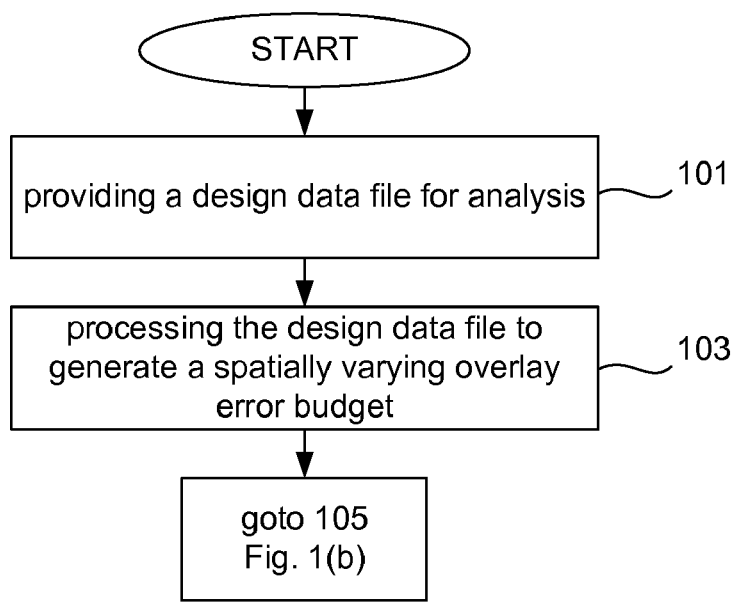
FIG. 1(a) is a flow diagram that illustrates one embodiment of a process for determining a spatially varying error budget for design data file used to generate an integrated circuit pattern in accordance with the principles of the invention.

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In general, the present invention encompasses an improved lot dispositioning procedure that takes into consideration the fact that the overlay error budget can vary over different portions of the inspected surfaces of a wafer or scanning field. In general, the process involves characterizing the design data file (i.e., a GDS file) associated with a fabrication processes that are used to form layers on a wafer. In general, the inventive methodologies process the design data file to generate a spatially varying overlay error budget whose overlay error budget values varies with spatial location across a substrate (e.g., a wafer) or with spatial location in a scanner or stepper field used to form various layers on the substrate. In one example, the design data file is analyzed to determine a spatially varying overlay error budget layer by layer and region by region to define to define a localized error budget for the various portions of a substrate surface such that the overlay alignment for two layers (formed over one another) can be characterized. For example, the design data file is analyzed to define an overlay error budget that defines an error budget for a process that fabricates a layer (e.g., a second layer) over an underlying layer having been previously formed (e.g., a first layer). In one example process, once a spatially varying overlay error budget has been determined for design data file, and a substrate has been processed to have patterned layer structures formed thereon, overlay metrology measurements are then made of the substrate. These overlay measurements are typically made by measuring overlay metrology targets (or other suitable target locations) to obtain overlay metrology information. Comparison of the measured overlay information with the spatially varying overlay error budget can be used to conduct a region by region inspection of the substrate surface to determine whether the measured (or modeled overlay) is in compliance with the spatially varying overlay error budget. Thus, various regions of the substrate can be checked for local overlay compliance. Dispositioning of the wafers can then be performed by using said comparison data (e.g., by comparing the measured overlay metrology information with the spatially varying overlay error budget). Those locations whose measured overlay metrology information exceeds the amounts allowable under the spatially varying overlay error budget may subject the associated wafer to rework and/or fabrication process parameter adjustment.

Thus, the acceptable degree of overlay error not only relies on the magnitude of the overlay error, but also the specific location of the overlay error. In accordance with the principles of the invention, the overlay error budget can be very tight in some areas but rather looser and less sensitive to placement errors in other areas. This means that if a fabricated wafer has relatively small overlay errors (i.e., less than a spatially varying overlay parameter for that region) in sensitive areas of the wafer (that require highly precise positioning and alignment of features), but does include some larger errors (perhaps larger than the prior art MEP) in another portion of the substrate, where the other portion of the substrate is subjected to less rigorous overlay constraints, the substrate may still be functional despite a larger overlay error in a less sensitive area. Accordingly, being able to assess overlay error in a manufacturing process using a spatially varying error budget has advantages. In particular, such a spatially varying error budget, in accordance with inventive methodologies and process embodiments disclosed herein, can reduce the amount of unnecessary wafer and process reworking and reduce reliance on the "worst case scenario" standard based on the tightest requirements of the devices being made that are currently used in the state of the art.

FIG. 1(a) is a flow diagram that illustrates some aspects of the invention. The flow diagram depicts a process for obtaining a spatially varying overlay budget from a design data file. In this process flow a design data file is provided for analysis (Step 101). This file is then analyzed to generate a spatially varying overlay budget (Step 103). The details of these operations are described below.

When substrates (such as semiconductor wafers) are patterned to create devices, they are patterned in a series of processes to form a series of layers formed one over another. Excellent alignment between the overlying layers has always formed a critical part of semiconductor device manufacture. This trend continues with ever increasing criticality required with continued miniaturization and ever shrinking process parameters and features sizes below the 32 nanometer (nm) node down to the 25 nm node and beyond. However, the inventors have noted that extreme placement accuracy is required for some features in a fabrication layer (e.g., array blocks, redundant columns/rows, column/row decoders, and so on), whereas less severe constraints may exist for other portions of the same layer (e.g., control logic circuitry, bonding pads, I/O structures, some types of interconnects, and so on). The placement of features on each layer is described by a circuit layout that can be characterized by a set of mask reticles that form the features and patterns of each layer. Most process steps are characterized by a mask reticle that is associated with that step. Each of the process steps are defined by a mask reticle which can be stored in computer readable form in a file generically referred to herein as the design data file discussed above. One example of such a file is a so-called GDS (Graphic Data System) file such as is commonly used to generate and store mask files. As is known to those having ordinary skill in the art GDS files are an accepted standard for describing integrated circuit layout and design data. These GDS files describe the relationship of IC (integrated circuit) fabrication layers to one another. Of critical importance is the alignment of one layer with all the other layers used to construct the IC. Of particular importance is the alignment of one layer (a first layer) with the adjacent overlying layer (for our purposes, a second layer) formed on the first layer. Such files are provided for analysis (Step 101).

The files are then processed to define a spatially varying overlay error budget for the file (Step 103). In particular, embodiments of the invention can determine a spatially varying overlay error budget that defines an acceptable degree of overlay error between the first layer and the second layer described above. This can be defined for every layer in the design data file. A design file is analyzed, layer by layer and region by region, using a set of design rules specified for the construction of the IC to determine the local tolerance of the various regions of the IC to overlay errors. For example, the design file including a first layer and an overlying second layer is analyzed. The design rules are implemented and processed together with the information in the design file to determine how the overlay budget changes for various regions of the surface. However, instead of providing a single, worst case number, a map of overlay tolerance over the entire modeled surface is generated to form a spatially varying overlay error budget. This analysis can be modeled for each layer formed using the design file. This information can be collected and stored as a spatially varying overlay error budget (stored as, for example, a design file). Such information has a variety of uses. As stated above, the design rules are used to verify the correctness of a mask set comprising the design data file. Generally these are specified by the needs of the of the final IC design.

As stated above, the overlay error tolerance can vary depending on the location on the substrate. The processing of Step 103 utilizes a set of design rules specified for the substrate in question. Such design rules are commonly used and well known in the art. Such design rules are typically user specified and determined by the needs of the circuit pattern. For example, very tight patterns comprising a number of features formed close together typically have a tighter tolerance than do less tightly patterned features that are separated by a greater distance between features.

In one implementation, the user, using skill and experience can define a set of regions defined here as "user specified error characterized regions" which are regions of a substrate (or a stepper/scanner field) characterized by different pattern densities. In one approach, specified "error characterized regions" can be defined by separate "functional" blocks. Functional blocks can be characterized as regions having substantially similar functions with similar design rules. For example, a region characterized by a series of I/O pads can be one functional block and another region characterized by dense array logic can be another. The inventors note that such functional blocks are merely examples and are not intended to be limiting. Error characterized regions can be delineated also by localized regional pattern density. Additionally, such error characterized regions can comprise a wide range of regions having a small overlay error tolerance (for example, regions having patterns with a high pattern density) whereas another error characterized region can be a region having a larger error tolerance (for example, regions having patterns with a lower pattern density). These regions are spatially arranged at different points on the substrate and can have a variety of different sizes. As indicated, each of these regions can be assigned a localized error budget. Thus, each error characterized region has its own error budget value. Thus, the overlay error budget varies as one examines various spatial regions across a surface of a substrate (or across a scanner/stepper field). Such a user specified spatially varying overlay error budget is but one way of implementing the principles of the invention. For example, one region can be the previously mentioned "array" region characterized by an overlay error tolerance of about 15 nanometers (nm) and another region can be I/O region characterized by a much looser overlay error tolerance of about 32 nm. Many such regions can exist in the design pattern for a substrate.

The inventors contemplate that a more commonly implemented embodiment will employ an automated design rule checking program to define a set of specified error characterized regions and then subsequently define an associated set of localized overlay error tolerances for each region to obtain a spatially varying overlay error budget for a substrate (or scanner/stepper field). Such a process is outlined with reference to FIG. 1(b). The inventors point out that "design rules" are a group of parameters (typically provided by a semiconductor manufacturer or designer) that enable an inspection to be performed that confirms the correctness of a mask set. Such design rules specify certain geometric and connectivity restrictions that ensure sufficient margins that account for variability in semiconductor manufacturing processes to enable that most manufactured parts work correctly. Such typically include width rules (which commonly specify a minimum width for each shape in the design), spacing rules (which commonly specify the minimum distance between two adjacent objects of a certain type), enclosure rules (which commonly specify that a certain type of structure must be covered by an associated structure formed on an overlying layer with some additional margin (e.g., 10 nm)), a minimum area rule, antenna rules, as well as many other design rules known to those having ordinary skill in the art. Other example rules include: active site to active site spacing, well to well spacing, transistor minimum channel lengths, minimum metal widths, metal fill densities, ESD and I/O rules, as well as many others not listed here. The list here intended to be descriptive rather than limiting. The definition and use of design rules is well known in the art. Many pre-made software packages have been constructed for such purposes.

Examples of such overlay modeling software include Calibre by Mentor Graphics, Hercules by Synopsys, Dracula and Assura by Cadence Design Systems, Quartz by Magma Design Automation, and many other such programs. For example, in one presently used method metrology data obtained from several sites on a wafer can be used to generate models of overlay error budgets (for example, a continuous model, e.g., using up to $3^{rd}$ order polynomials and the like).

However, the inventors point out that such software packages have been heretofore employed to generate a single dispositioning parameter meant to be employed for an entire wafer. This is distinct from the present invention which is employs design rule checking software to generate an overlay budget that varies with region across a wafer (or across a stepper/scanner field). Thus, one key difference from the present approach as discerned from the prior art is that the prior art employed these automated tools to determine the absolute "worst case" scenario. Thus, the design data file was analyzed and the tightest tolerance parameter was determined. This MEP was then used to gauge the entire wafer. If any overlay error was measured that exceeded the MEP the wafer was reworked and the fabrication process subjected to a thorough troubleshooting analysis to remedy the situation. The time and money wasted in having such a narrow analysis is self-evident.

Figure 1B:
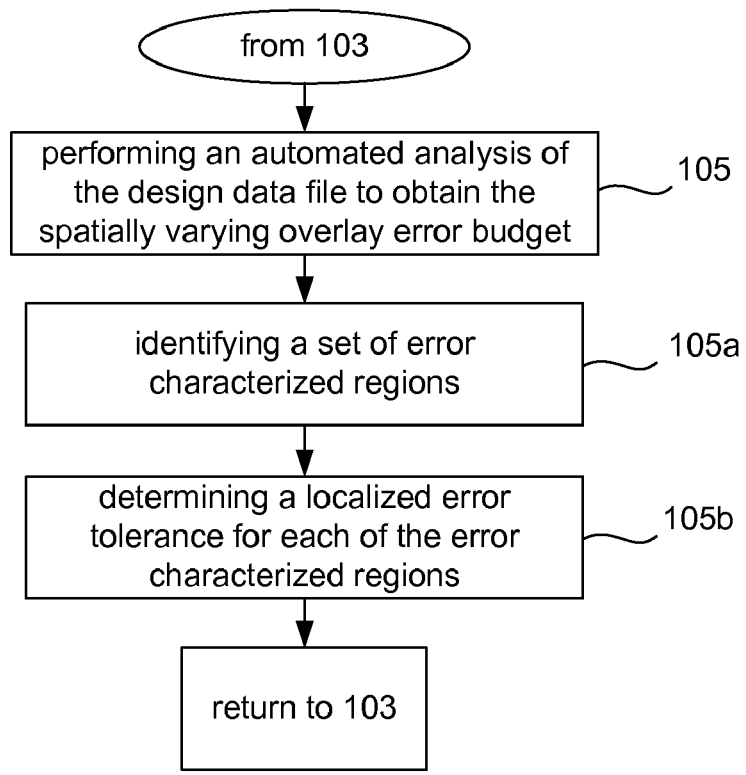
FIG. 1(b) is a flow diagram that illustrates one embodiment of an automated process for determining a spatially varying error budget for design data file in accordance with the principles of the invention.

With continued reference FIG. 1(b), the process of performing an automated analysis to obtain a spatially varying overlay budget (Step 105) can include the operations of identifying (or defining) a set of error characterized regions (i.e., regions having similar error parameters and error tolerances over a specified region) (Step 105a) and determining a localized error tolerance for each of said regions (Step 105b). It is to be pointed out that a localized error tolerance can be modeled over an entire substrate surface on a pixel by pixel basis if desired. Thus, once a localized error tolerance is determined for each error characterized region, a spatially varying overlay error budget has been obtained.

In one generalized example, a first error characterized region can, for example, be characterized by a region where the design rule is that each of the polygons in the region must be separated by a first minimum distance (e.g., 15 nm). And a second error characterized region can, for example, be characterized by another region where the design rule is that each of the polygons in the second region must be separated by a second minimum distance (e.g., 40 nm). Thus, two regions of differing overlay error budget are defined for the substrate or the field.

The process can be further refined by employing lithographic models of the fabrication process to further increase the fidelity of the spatially varying overlay error budget. Such lithographic models can be incorporated into the spatially varying overlay error budget and take into consideration variation in the optical systems used to form the patterns on the substrate. Typical examples model exposure and focus parameters for the lithography equipment and lithography processes used by the associated fabrication processes. Additionally, parameters that specify the lithographic process window can be incorporated to further define the spatially varying overlay error budget. Many other lithographic parameters can be incorporated into such lithographic simulation modeling. Examples include, but are not limited to Gate CD, Profile, Dosages & Energies, and Temperature.

Additionally, the accuracy of the spatially varying overlay error budget can be further adjusted by implementing other non-lithographic fabrication process parameter simulations. Such simulations will be referred to here generically as process simulations and simulate process parameters like over material layer thickness errors and imperfections and can include, over/under deposition of materials, over/under etching (to include CMP and other polishing processes) of materials, as well as other factors. Additionally, process parameters that specify the (non-lithographic) process window can be incorporated to further define the spatially varying overlay error budget. Many other process parameters can be incorporated into such process simulation modeling. Examples include, but are not limited to etch times, temperatures, copper density, copper thickness profiles, and so on.

Thus, by providing a design data file that characterizes fabrication processes used to form the patterned layers of a substrate (including, for example, the fabrication processes used for forming a first and second patterned layer on a semiconductor substrate) spatially varying overlay error budget can be generated for the substrate. The overlay error budget generally varies depending on tolerances specified by the design rules. Accordingly, the spatially varying overlay error budget models a local tolerance of various portions of patterns formed on the substrate to overlay errors. Portions of the patterns that are relatively tolerant to the presence of overlay error having a relatively larger error budget and portions of the patterns that are relatively intolerant of overlay error having a relatively smaller error budget, thereby defining a spatially varying overlay error budget.

These spatially varying overlay budgets provide a useful map of a substrate surface and can be used to monitor the effectiveness of fabrication processes. Additionally, and importantly, such spatially varying overlay budgets can be compared with measured overlay information to determine whether a process layer has been fabricated with the required degree of alignment and pattern fidelity. Such information can be used to determine whether a wafer (or other fabricated substrate) is within specification or requires reworking. Additionally, inspecting a stream of wafers or a wafer fabrication process can enable process engineers to track whether the monitored processes are "drifting". In other words the inspection data can be used to track whether the results of a specified set of fabrication conditions remain stable over time or whether they change in an undesirable fashion over time. Advantageously, in some embodiments, the fabrication conditions can be adjusted during processing to compensate for changing results in the outcome to correct unwanted process deviations.

Figure 2A:
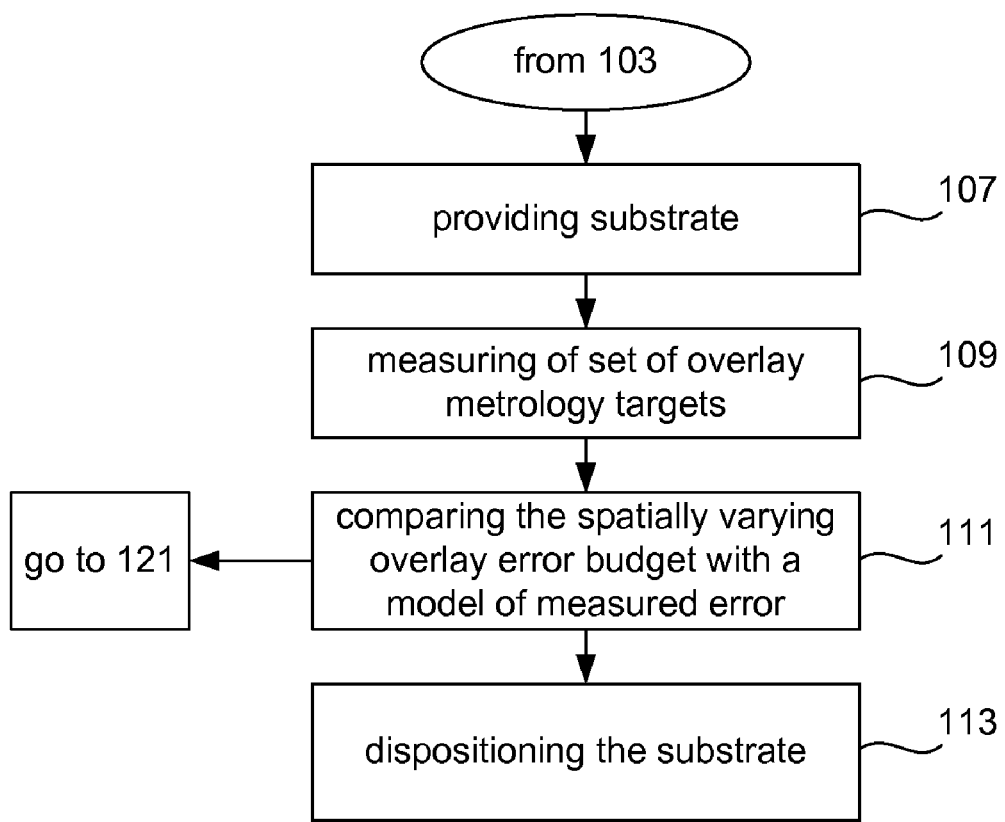
FIG. 2(a) is a flow diagram that illustrates one embodiment of a process for comparing overlay error with a spatially varying error budget to enable substrate dispositioning in accordance with the principles of the invention.

FIG. 2(a) is a flow diagram that illustrates further processing that can employ the spatially varying error budget information determined previously. For example, FIG. 2(a) depicts a continuation of the process illustrated in FIGS. 1(a) & 1(b). In continuation, a substrate is provided (Step 107). This substrate is typically a semiconductor wafer but can be any suitable substrate. This step can include a process of forming a first patterned layer on the substrate having a first pattern and also the process of forming a second patterned layer on the first layer. The process also includes the process of forming a plurality of overlay metrology targets. The processes of forming such layers and targets are well known in the art.

Figure 3:
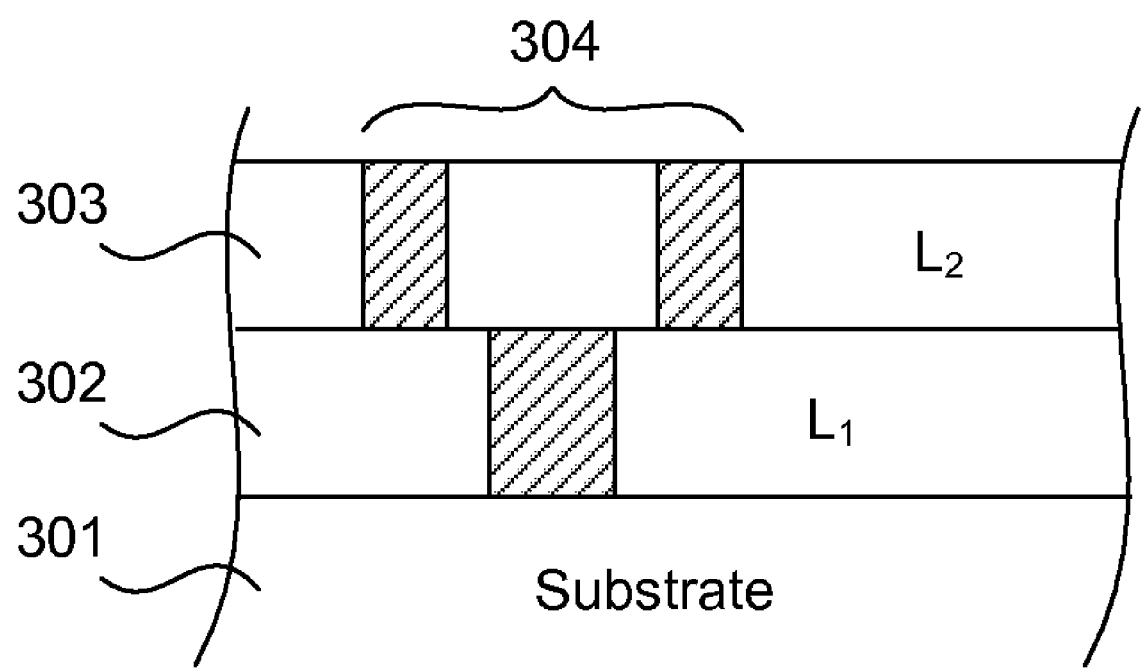
FIG. 3 is a simplified cross-section diagram illustrating a portion of a wafer substrate showing at least two layers and an overlay metrology target in accordance with some embodiments of the invention It is to be understood that in the drawings like reference numerals designate like structural elements. Also, it is understood that the depictions in the Figures are not necessarily to scale.

This is illustrated using the depiction of FIG. 3. FIG. 3 shows a typical measurement subject 300 comprising a substrate 301 (commonly a semiconductor wafer) having a first patterned layer 302 ($L_1$) fabricated at the top of the substrate 301. Also, shown is the second patterned layer 303 ($L_2$) formed on the first patterned layer 302. Such wafers 301 and layers 302, 303 can be formed in accordance with many different wafer fabrication techniques known to those having ordinary skill in the art. Also, shown in this cross-sectional depiction of a substrate is an example of an overlay metrology target 304. Such a target comprises one of a plurality of such overlay metrology targets formed on the many layers of the subject. The depicted example overlay target, is a figuratively represented box-in-box type target 304. The patentee's specifically point out that many other such overlay metrology targets are contemplated in accordance with the principles of the invention.

Returning to a discussion of FIG. 2(a), overlay measurements are performed on the metrology targets to obtain overlay error information concerning the layers formed on the substrate (Step 109). The methods and approaches used to obtain accurate and valid overlay information from said overlay metrology targets are well known to those of ordinary skill. Typically, the measured overlay information is then processed to generate an error model that characterizes the overlay error as a function of position on the substrate surface. Thus, the model provides an error map of the substrate.

The error map (i.e., the overlay error model for the substrate) is compared with the spatially varying overlay error budget (Step 111). Based on said comparison, the disposition of the substrate is determined (Step 113). In one embodiment, dispositioning includes a determination as to whether a fabrication process meets the error tolerances specified by the spatially varying overlay error budget. For example, such dispositioning can be used to determine whether the fabrication of a second layer pattern on the substrate (over an underlying first layer) meets the error tolerances specified by the spatially varying overlay error budget defined for the substrate fabrication processes.

Such dispositioning can be a decision to accept or reject a wafer based on the fabrication of a most recent layer. In one implementation, the dispositioning can be a decision to rework a wafer or to continue further fabrication of the wafer.

Figure 2B:
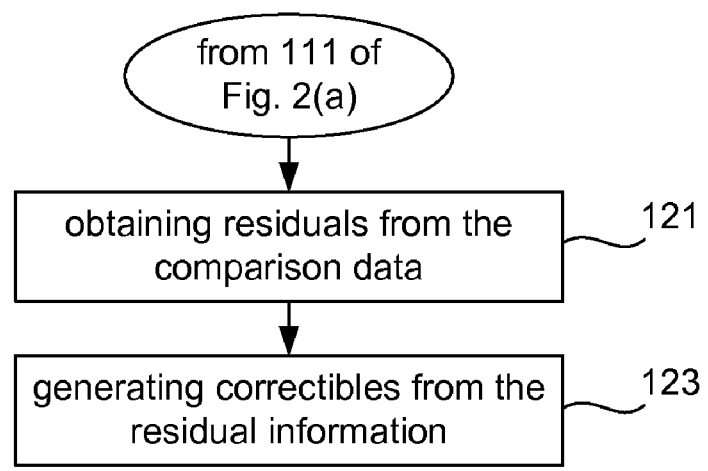
FIG. 2(b) is a flow diagram that illustrates one embodiment of a process for obtaining residuals and generating correctibles in accordance with the principles of the invention.

In another implementation, the process of comparing the error map with the spatially varying overlay error budget (Step 111) can be employed to track process performance or correct various parameters in a fabrication process. An embodiment of such processes is explained with reference to FIG. 2(b). By comparing the error map with intended ideal pattern, a map of "residuals" can be generated for the substrate (Step 121). Residuals being a measure of the difference between the measured (modeled) overlay error and the ideal perfectly aligned set of layers having no overlay error. In one embodiment, the residuals can be determined on a region by region basis. In one implementation, the regions are the previously determined error characterized regions. These residuals can be provided to process engineers, who can in turn (based on the information), generate a set of correctibles that enable improvements to the fabrication so that the residuals are reduced for wafers subsequently fabricated (Step 123). Examples of such correctibles include changes in the process and lithographic parameters used in the wafer fabrication processes. Changes in focus, alignment position, and many other parameters can implemented. Moreover, due to the spatially sensitive nature of the information, these correctibles can be implemented on a spatial basis over a target surface. Such is particularly suited to a stepper or scanner type lithography device where the parameters and/or correctibles may vary for each scanner or stepper field.

Additionally, in the process of obtaining the residuals (Step 121), the residuals can be monitored and tracked over time and time related residual information can be provided to process engineers, who can in turn (based on the information), determine whether the fabrication process parameters are drifting in a way that affects overlay. Corrective action can be taken earlier in the process based on trends identified by the process.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that many different method operations and configurations can be employed to generate spatially varying error budgets and to accomplish wafer dispositioning in accordance with the principles of the invention. Although only a few approaches are expressly disclosed herein, it should be appreciated by anyone having ordinary skill in the art that, using the teachings disclosed herein, many different configurations can be implemented and still fall within the scope of the claims. Further, reference in the claims to an element in the singular is not intended to mean "one and only one" unless explicitly stated, but rather, "one or more". Furthermore, the embodiments illustratively disclosed herein can be practiced without any element that is not specifically disclosed herein.

We claim:

1. A method for generating a design rule map having a spatially varying design rule overlay budget, the method comprising:

providing a design data file that characterizes a fabrication process used for forming a pattern on a semiconductor substrate where information contained in the design data file includes pattern information concerning patterns formed on a first layer of a semiconductor substrate and pattern information concerning patterns formed on a second layer that is formed over the first layer of a semiconductor substrate;

processing the information contained in the design data file to generate a design map that includes a spatially varying overlay error budget for the design map using a computer processor, comprising:

characterizing the design map as a set of user defined regions, including characterizing a first portion of the map as having a first pattern density and second portion of the map as having a second pattern density, and characterizing the first portion having the first pattern density as comprising a portion of the design map were a minimum distance between polygons comprises a first minimum distance and characterizing the second portion having the second pattern density as comprising a portion of the design map were a minimum distance between polygons comprises a second minimum distance; and defining the localized tolerance to overlay errors for each region in the set of user defined regions including defining a first local tolerance to overlay errors for the first portion of the map having a first pattern density and defining a second local tolerance to overlay errors for the second portion of the map having a second pattern density, and defining a first local tolerance to overlay errors as said first minimum distance for the first portion of the map and defining a second local tolerance to overlay errors as said second minimum distance for the second portion of the map, where the spatially varying overlay error budget defines a localized tolerance to overlay errors for different spatial locations on the design map, with portions of the map having a pattern that is relatively tolerant of overlay error having a relatively larger overlay error budget and portions of the map having a pattern that is relatively intolerant of overlay error having a relatively smaller overlay error budget, thereby defining an design map having a spatially varying overlay error budget.

2. The method recited in claim 1 wherein
characterizing the design map as a set of user defined regions includes defining the design map as including a set of functional blocks; and
defining a local tolerance to overlay errors comprises defining a first local tolerance to overlay errors for a first functional block and defining a second local tolerance to overlay errors for a second functional block.

3. The method recited in claim 1 wherein processing the information contained in the design data file to generate the spatially varying overlay error budget for the design map comprises:
conducting an automated analysis of the design data file, the analysis including:
characterizing a set of specified error characterized regions; and
defining a local error tolerance to overlay errors for each region in the set of error characterized regions.

4. The method recited in claim 1 wherein processing the information contained in the design data file to generate the spatially varying overlay error budget for the design map comprises:
conducting an automated analysis of the design data file wherein the analysis incorporates a simulation of lithographic fabrication processes to be used in said forming of the pattern on the semiconductor substrate.

5. The method recited in claim 4 wherein the automated analysis of the design data file that incorporates said simulation of lithographic fabrication processes includes:
characterizing a set of specified error characterized regions by performing a lithographic simulation of the fabrication processes; and
defining a local error tolerance for overlay errors for each region in the set of error characterized regions based on the results of said lithographic simulation.

6. The method recited in claim 4 wherein performing the lithographic simulation of the fabrication process includes varying lithographic process parameters.

7. The method recited in claim 4 wherein performing the lithographic simulation of the fabrication process includes varying lithographic process parameters over a range of parameters that defines a process window for the lithographic fabrication process to be used in said forming of the pattern on the semiconductor substrate.

8. The method recited in claim 4 wherein conducting the automated analysis of the design data file further includes simulation of non-lithographic fabrication processes to be used in said forming of the pattern on the semiconductor substrate wherein said simulation further enables the generation of the spatially varying overlay error budget for the design map.

9. The process of claim 8 wherein automated analysis that incorporates a simulation of non-lithographic fabrication processes further includes:
further characterizing the set of specified error characterized regions by performing the non-lithographic fabrication process simulation of the fabrication process; and
further defining the local error tolerance to overlay errors for each region in the set of error characterized regions based on the results of said non-lithographic fabrication process simulation.

10. The method recited in claim 8 wherein performing the non-lithographic simulation of the fabrication process includes varying the non-lithographic process parameters over a range of parameters that defines a process window for the fabrication process to be used in said forming of the pattern on the semiconductor substrate.

11. The method recited in claim 8 wherein performing the non-lithographic process simulation of the fabrication process includes simulating process parameters comprising at least one of deposition parameters, etching parameters, and polishing parameters.

12. The method in claim 1 further comprising:

providing a wafer substrate for evaluation, the wafer substrate having features formed thereon, wherein said features are fabricated in accordance with pattern information contained within the design data file, wherein the wafer substrate comprises at least one layer of features is formed over an underlying pattern of features and wherein the evaluated substrate includes a plurality of overlay metrology targets;

performing a plurality of overlay metrology measurements on the overlay metrology targets to obtain a plurality of overlay error measurements; and comparing the overlay error measurements with the spatially varying design rule overlay error budget for the design map; and dispositioning said wafer substrate based on whether the overlay error measurements are in compliance with the spatially varying design rule overlay error budget for the design map.

13. The method in claim 12 wherein:

performing the plurality of overlay metrology measurements further includes processing the measurements to obtain a model of measured overlay error for various portions of the wafer; and comparing the overlay error measurements with the spatially varying design rule overlay error budget comprises comparing the model of measured overlay error with the spatially varying design rule overlay error budget; and dispositioning said wafer substrate comprises dispositioning the wafer based a comparison of the model of measured overlay error with the spatially varying design rule overlay error budget to determine whether the wafer is in compliance with the spatially varying design rule overlay error budget for the design map.

14. A method for tracking and adjusting fabrication parameters used to form layers on a substrate, the method comprising:

providing a set of substrates, each substrate having an uppermost layer being defined as a first pattern layer;

fabricating a second pattern layer over the first pattern layer, said first and second layers further including a plurality of overlay metrology targets formed at different locations on each substrate using a computer processor;

performing a plurality of metrology measurements on the metrology targets of each substrate to obtain measured overlay error information for each of the different locations on each substrate;

processing the measured overlay error information for each substrate to generate a measured overlay error model for each substrate;

processing a design data file that characterizes fabrication processes used on the substrates, including those processes used for forming the first and second pattern layers on the substrates, wherein said processing generates a spatially varying overlay error budget operable on each of the substrates, wherein the overlay error budget varies for different portions of the substrate surface depending on a local tolerance of various portions of the substrate surface to overlay errors;

obtaining, for each substrate, a spatially varying set of residuals that characterize the degree of measured overlay error as a function of position on the measured substrate; and dispositioning the wafers based on said residuals where dispositioning the wafers includes
comparing a first set of residuals obtained from a first substrate of the set of substrates with subsequent sets of residuals determined from other substrates in the set of substrates; and
determining, based on said comparison, whether the measured overlay error is changing with time as each subsequent substrate in the set of substrates has an associated second pattern layer formed thereon; and adjusting fabrication parameters used to form the second pattern layer based on information obtained from said comparison of the first set of residuals obtained from the first substrate and from the subsequent sets of residuals determined from the other substrates and said determination that the measured overlay error is changing with time as each subsequent substrate has a second pattern layer formed thereon.

15. The method of claim 14 further including:

generating, for each substrate, a set of correctibles associated with the set of residuals for that substrate, said correctibles enabling adjustment of fabrication parameters used to form the second pattern layers; and adjusting the fabrication parameters used to form the second pattern layers as needed using said correctibles.

16. The method of claim 14 further including:

generating, for each substrate, a set of correctibles associated with the set of residuals for that substrate, said correctibles enabling adjustment of fabrication parameters used to form the second pattern layers.

* * * * *